US012004332B2

(12) United States Patent
Moreno et al.

(10) Patent No.: US 12,004,332 B2
(45) Date of Patent: Jun. 4, 2024

(54) COOLING AUTOMOTIVE POWER ELECTRONICS

(71) Applicants: Alliance for Sustainable Energy, LLC, Golden, CO (US); BorgWarner, Inc., Auburn Hills, MI (US)

(72) Inventors: Gilberto Moreno, Thornton, CO (US); Sreekant Venkat Jagannath Narumanchi, Golden, CO (US); Xuhui Feng, Golden, CO (US); Ammar Osman, Golden, CO (US); Steve Michael Myers, Oxford, MI (US); Brian James Kelly, Lakewood, CO (US); Paul Philip Paret, Denver, CO (US)

(73) Assignees: Alliance for Sustainable Energy, LLC, Golden, CO (US); BorgWarner, Inc., Auburn Hills, MI (US)

( * ) Notice: Subject to any disclaimer, the term of this patent is extended or adjusted under 35 U.S.C. 154(b) by 153 days.

(21) Appl. No.: 17/573,445

(22) Filed: Jan. 11, 2022

(65) Prior Publication Data
US 2022/0225546 A1 Jul. 14, 2022

Related U.S. Application Data

(60) Provisional application No. 63/137,366, filed on Jan. 14, 2021.

(51) Int. Cl.
*H05K 7/20* (2006.01)
*B60K 11/02* (2006.01)
(Continued)

(52) U.S. Cl.
CPC ..... *H05K 7/20927* (2013.01); *H05K 7/20272* (2013.01); *H05K 7/209* (2013.01);
(Continued)

(58) Field of Classification Search
CPC ........... H05K 7/20254; H05K 7/20272; H05K 7/20345; H05K 7/20927; H01L 23/473; H01L 23/4735; H01G 2/08; B60K 11/02
See application file for complete search history.

(56) References Cited

U.S. PATENT DOCUMENTS 7,061,761 B2   6/2006  Tucker et al.
7,611,402 B2   11/2009 McClellan et al.
(Continued)

OTHER PUBLICATIONS

"Alpha-6 Fluid—Synthetic Heat Transfer Fluid for Transformers, Switchgear and Industrial Processes", available at https://dsiventures.com/wp-content/uploads/2013/02/PDS-Alpha-6.pdf, accessed Apr. 12, 2022, p. 1.
(Continued)

*Primary Examiner* — Zachary Pape
*Assistant Examiner* — Steven Ngo
(74) *Attorney, Agent, or Firm* — Alexandra M. Hall

(57) ABSTRACT

The present disclosure relates generally to methods and devices for the cooling (or removal of heat from) power electronics modules in automotive vehicles, wherein the cooling is done by positioning the power electronics module in a housing, directing a fluid into the housing, and impinging the fluid onto the power electronics module and/or an electrical connection in contact with the power electronics module.

8 Claims, 19 Drawing Sheets

(51) Int. Cl.
*H01G 2/08* (2006.01)
*H01L 23/473* (2006.01)

(52) U.S. Cl.
CPC ............... *B60K 11/02* (2013.01); *H01G 2/08* (2013.01); *H01L 23/473* (2013.01)

(56) References Cited

U.S. PATENT DOCUMENTS

| | | |
|---|---|---|
| 9,295,185 B2 | 3/2016 | Icoz et al. |
| 9,516,782 B2 | 12/2016 | Fuchs |
| 9,655,281 B2 | 5/2017 | Harvilchuck et al. |
| 10,645,844 B2 | 5/2020 | Dariavach et al. |
| 11,061,450 B2 | 7/2021 | Tsai et al. |
| 2007/0230127 A1* | 10/2007 | Peugh ................... H01L 23/053 361/699 |
| 2016/0268867 A1* | 9/2016 | Mackowiak ............. B60K 6/38 |
| 2016/0322333 A1* | 11/2016 | Fuergut ................. H01L 23/473 |
| 2019/0335628 A1* | 10/2019 | Lei ..................... H05K 7/20872 |
| 2020/0211927 A1* | 7/2020 | Wan ..................... H01L 23/473 |
| 2021/0212242 A1 | 7/2021 | Moreno et al. |
| 2022/0130735 A1* | 4/2022 | Coppola .................. H01L 23/46 |
| 2022/0230938 A1* | 7/2022 | Coppola ............. H01L 21/4882 |
| 2023/0114057 A1* | 4/2023 | Rush .................. H05K 7/20936 361/699 |

OTHER PUBLICATIONS

Moreno et al., "Passive Two-Phase Cooling of Automotive Power Electronics", Preprint, Presented at Semi-Therm Mar. 2014, San Jose, California, NREL/CP-5400-61083, pp. 1-10.

Osman, "Single Phase Jet Impingement on Enhanced Surfaces as a Cooling Solution for SiC Inverter Power Modules", In Partial Fulfillment of the Requirements for the Degree Master of Science in the George W. Woodruff School of Mechanical Engineering, Georgia Institute of Technology, May 2021, pp. 1-119.

Satheesh et al., "Trends in Automotive Power Electronics—Power Modules for HEV, PHEV & EV", available at https://www.powersystemsdesign.com/articles/trends-in-automotive-power-electronics/30/7569, Jul. 25, 2014, pp. 1-3.

* cited by examiner

COOLING AUTOMOTIVE POWER ELECTRONICS

CROSS-REFERENCE TO RELATED APPLICATIONS

This application claims priority from U.S. Provisional Application No. 63/137,366 filed on Jan. 14, 2021, the contents of which are incorporated herein by reference in their entirety.

CONTRACTUAL ORIGIN

This invention was made with United States government support under Contract No. DE-AC36-08GO28308 awarded by the U.S. Department of Energy. The U.S. government has certain rights in this invention.

BACKGROUND

The power electronics module (or semiconductor power module) is the key power electronics component in most hybrid and electric vehicles. Examples of power electronics modules include insulated-gate bipolar transistors modules (IGBT modules), diodes, or metal-oxide semiconductor field effect transistors modules (MOSFET modules). The power electronics module, found in the inverter, distributes energy throughout the hybrid or electric vehicle. Improving the energy efficiency of these power electronics modules is a key to improving energy efficiency of hybrid and electric vehicles and improving their battery range.

According to Oak Ridge National Laboratory, power electronics can account for up to 40% of the total traction drive cost in hybrid vehicles. Increasing vehicle electrification requires making electric drive vehicles (i.e., hybrid and electric vehicles) cost competitive with conventional gasoline and diesel-powered vehicles. One means of reducing cost is improving the energy density of automotive power electronics. Power electronics modules can generate significant amounts of heat, which needs to be removed from the power electronics module for proper functioning of the power electronics module and the vehicle as a whole. Cooling systems can be large and add weight and cost to the vehicle, as well as a point of failure for operations of the vehicle. Thus, there remains a need for smaller and lighter power electronic components.

SUMMARY

An aspect of the present disclosure is a system for cooling a power electronics module using a fluid, the system including a housing including a thickness and configured to contain the power electronics module, a molding configured to extend through the thickness and contact at least a portion of the power electronics module, an electrical connection configured to extend through the molding and contact at least a portion of the power electronics module, and a manifold positioned within the housing, wherein the power electronics module includes a first side and a second side, the manifold is configured to direct the fluid to contact the first side and the second side, and the fluid is configured to contact the power electronics module and the electrical connection inside the housing. In some embodiments, the system also includes a first port configured to extend through the thickness, and a second port configured to extend through the thickness, in which the fluid is configured to enter the housing through the first port, and the fluid is configured to exit the housing through the second port. In some embodiments, the fluid includes a dielectric fluid. In some embodiments, the dielectric fluid includes a synthetic hydrocarbon. In some embodiments, the synthetic hydrocarbon may be at least one of mineral oil, hexane, heptane, silicone oil, water, benzene, an ester, transformer oil, a perfluoroalkane, or an alkane. In some embodiments, the molding is configured to create a seal with the thickness, and the seal includes interlocking grooves of the molding and the thickness. In some embodiments, the molding is configured to contact the first side and the second side of the power electronics module. In some embodiments, the electrical connection includes a planar surface which extends through the molding, the molding includes at least one slot, and the electrical connection extends through the slot. In some embodiments, the electrical connection includes a cylindrical extension which extends through the thickness, the cylindrical extension is configured to create a seal with the thickness, and the seal includes interlocking grooves of the cylindrical extension and the thickness. In some embodiments, the manifold includes a first channel and a second channel, the first channel is configured to direct the fluid to the first side of the power electronics module, and the second channel is configured to direct the fluid to the second side of the power electronics module.

An aspect of the present disclosure is a system for cooling a power electronics module using a fluid, the system including a housing configured to contact the power electronics module, an electrical connection configured to extend through the housing and configured to contact the power electronics module, a manifold contained within the housing having at least one jet, and a plate connected to the power electronics module and oriented substantially parallel to the manifold; wherein, in which the fluid is configured to enter the manifold, exit the jet, and impinge on the plate. In some embodiments, the system also includes a plurality of fins extending from the plate; in which the fluid is configured to contact the plurality of fins after exiting the slot. In some embodiments, the plurality of fins includes at least one fin having an elliptical cross-section. In some embodiments, the plurality of fins includes at least one folded fin, the folded fin includes a first side and a second side joined at an angle, and the first side and the second side contact the plate. In some embodiments, at least one folded fin includes a slot, and the slot includes a cutout in the first side and the second side at the angle. In some embodiments, the system includes a first port connected to the housing, and a second port connected to the housing, in which the fluid is configured to enter the housing through the first port, and the fluid is configured to exit the housing through the second port.

An aspect of the present disclosure is a method for cooling a power electronics module using a fluid, the method including positioning the power electronics module within a housing; and directing the fluid to contact the power electronics module, in which the power electronics module includes a first side and a second side, and the directing includes using a manifold to direct the fluid to contact the first side and the second side of the power electronics module. In some embodiments, the housing includes a thickness, and the positioning includes extending a molding through the thickness to contact at least a portion of the power electronics module. In some embodiments, the molding and the thickness create a seal, and the seal includes interlocking groves of the molding and the thickness. In some embodiments, the positioning also includes extending an electrical connection through the molding to contact at least a portion of the power electronics module and extending an electrical connection through the thickness to contact at least a portion of the power electronics module. In some embodiments, the directing also includes allowing the fluid to enter the housing through a first port, contacting the power electronics module with the fluid, and allowing the fluid to exit the housing through a second port.

BRIEF DESCRIPTION OF DRAWINGS

Some embodiments are illustrated in referenced figures of the drawings. It is intended that the embodiments and figures disclosed herein are to be considered illustrative rather than limiting.

REFERENCE NUMERALS

Figure 1:
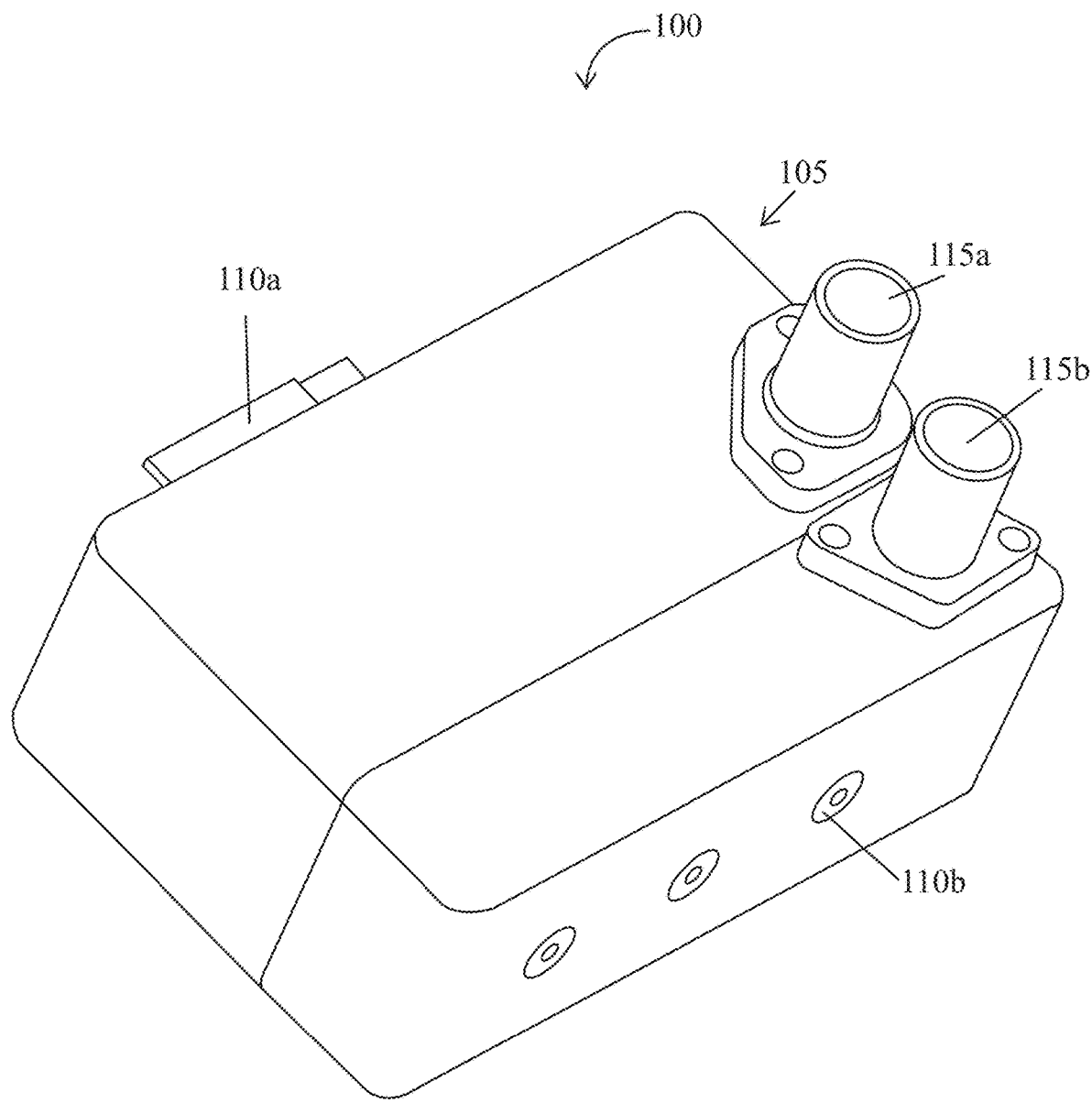
FIG. 1 illustrates a first exemplary device for cooling a power electronics module using a fluid, according to some aspects of the present disclosure.

100 . . . first exemplary device
105 . . . housing
107 . . . external surface
110 . . . electrical connections
115 . . . port
120 . . . molding
125 . . . power electronics module
130 . . . manifold
135 . . . tube
140 . . . opening
145 . . . groove
150 . . . jet
155 . . . channel
160 . . . slot
165 . . . fins
300 . . . third exemplary device
400 . . . method
405 . . . positioning
410 . . . directing
415 . . . impinging

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to cooling power electronics modules using a fluid. Manifolds may be used for directing fluid flow. At least one heat source, such as a semiconductor, switch, transistor, diode, and/or switching semiconductor, may be enclosed within an exemplary device as described herein. The exemplary devices described herein may direct cooling fluid to contact the power electronics module and/or the busbars of the power electronics module directly. In some embodiments, the cooling fluid may be a dielectric fluid (such as transmission fluid). In other embodiments, the cooling fluid may be a mixture including ethylene glycol.

Figure 2:
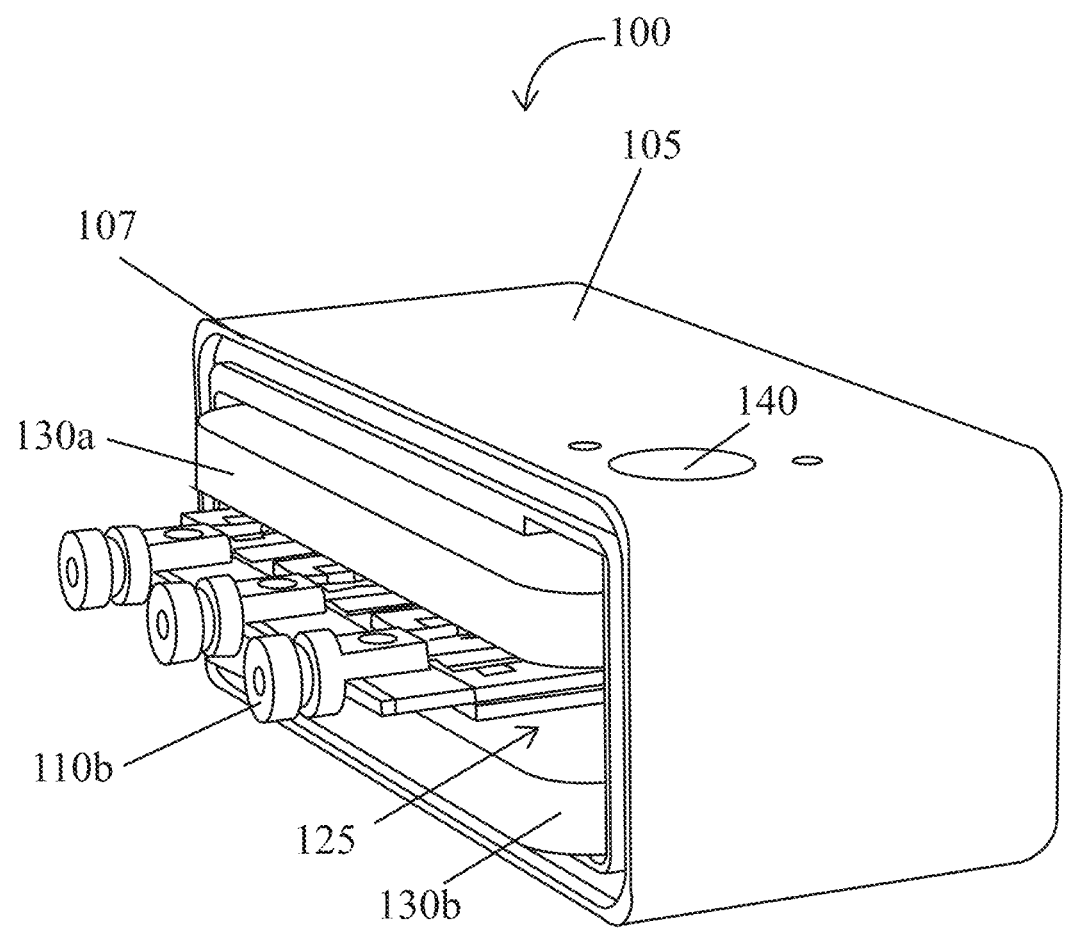
FIG. 2 illustrates an internal view of the first exemplary device for cooling a power electronics module using a fluid, according to some aspects of the present disclosure.
Figure 3:
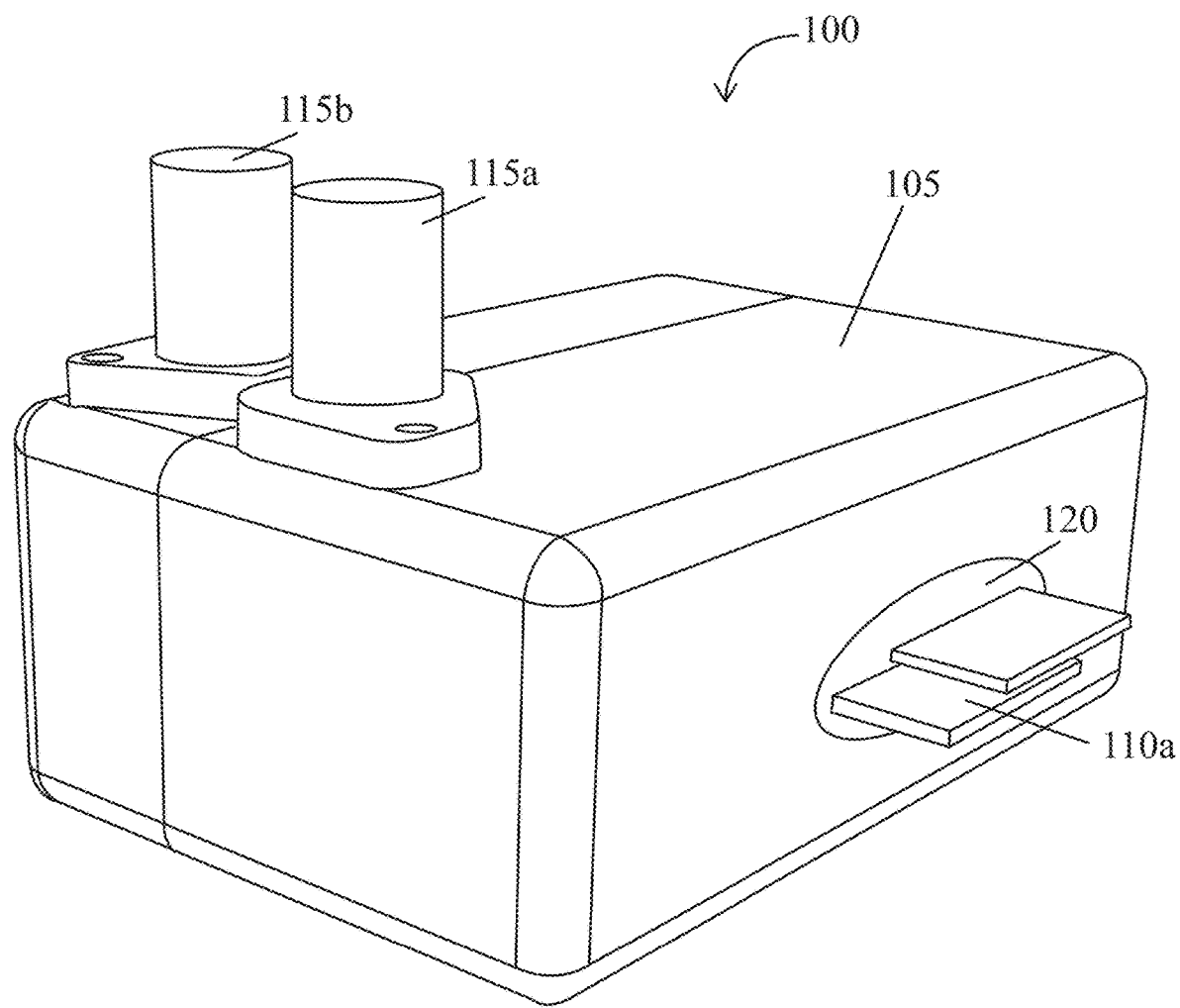
FIG. 3 illustrates a rear view of the first exemplary device for cooling a power electronics module using a fluid, according to some aspects of the present disclosure.

FIG. 1 illustrates a first exemplary device 100 for cooling a power electronics module 125 (not shown in FIG. 1) using a fluid, according to some aspects of the present disclosure. FIG. 2 illustrates an internal view of the first exemplary device 100 and FIG. 3 illustrates a rear view of the first exemplary device 100 for cooling a power electronics module using a fluid, according to some aspects of the present disclosure. The first exemplary device 100 may contact both the top side and bottom side of the power electronics module 125 with the fluid. The first exemplary device 100 for using a fluid has a housing 105 which has a thickness 107 and contains the power electronics module 125. A molding 120 extends through the thickness 107 and contact at least a portion of the power electronics module 125 inside the housing 105. At least one electrical connection 110a extends through the molding 120 and contacts at least a portion of the power electronics module 125. A manifold 130 is positioned within the housing 105 and contacts both sides of the power electronics module 125 (via an upper manifold 130a and a lower manifold 130b). The manifold 120 has channels 155 and jets 150 (see FIG. 6B) which may direct a fluid to contact at least a portion of the power electronics module 125 on both sides inside the housing 105. A first port 115a and a second port 115b may extend through the thickness. The first port 115a may act as an inlet and allow the fluid to enter the housing 105 and the second port 115b may act as an outlet and allow the fluid to exit the housing 105.

In some embodiments, the molding 120 may create a seal with the thickness 107 of the housing 105, which may be a substantially fluid seal (i.e., substantially free of leaks when the housing 105 contains a fluid). The seal may be formed through interlocking grooves 145 on the molding 120 and/or the thickness 107 (i.e., the seal may be a mechanical seal). The grooves 145 may be made using an o-ring or other gasket material to facilitate the tight seal between the thickness 107 and the molding 120. The exemplary molding 120 shown in FIGS. 4-5 has a substantially rectangular section and a substantially elliptical section. Slots 160 extend through the molding for electrical connections 110 to fit through. The slots 160 may be substantially the shape of the cross-section of the electrical connections and may fit "snugly" so as to create a fluid or mechanical seal between the molding 120 and the electrical connections 110.

Figure 4A:
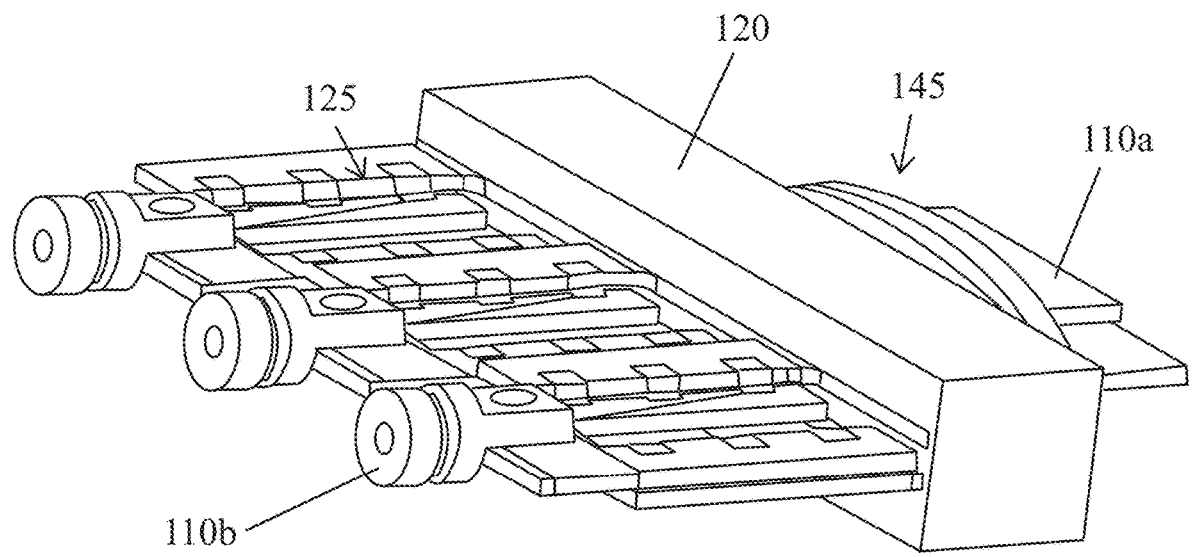
FIG. 4A illustrates some of the internal components in the first exemplary device for cooling a power electronics module using a fluid of FIGS. 1-3.
Figure 4B:
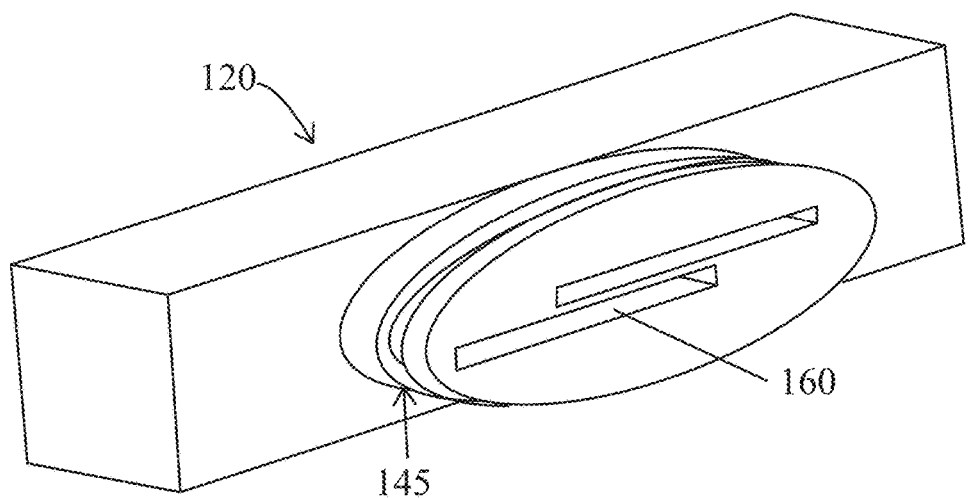
FIG. 4B illustrates a rear view of the molding of the device for cooling a power electronics module using a fluid according to some aspects of the present disclosure.

FIG. 4A illustrates some of the internal components in the first exemplary device for cooling a power electronics module 125, according to some aspects of the present disclosure. In some embodiments, the molding 120 may contact both sides of the power electronics module 125. In some embodiments, the molding 120 may encompass the power electronics module 125 (i.e., contact all sides of the power electronics module 125) as shown in FIG. 4A. A rear view of the molding 120 is shown in FIG. 4B. The molding 120 has grooves 145 for creating a seal with the thickness 107 of the housing 105 and slots 160 for electrical connections 110 to extend through the molding 120.

Figure 5:
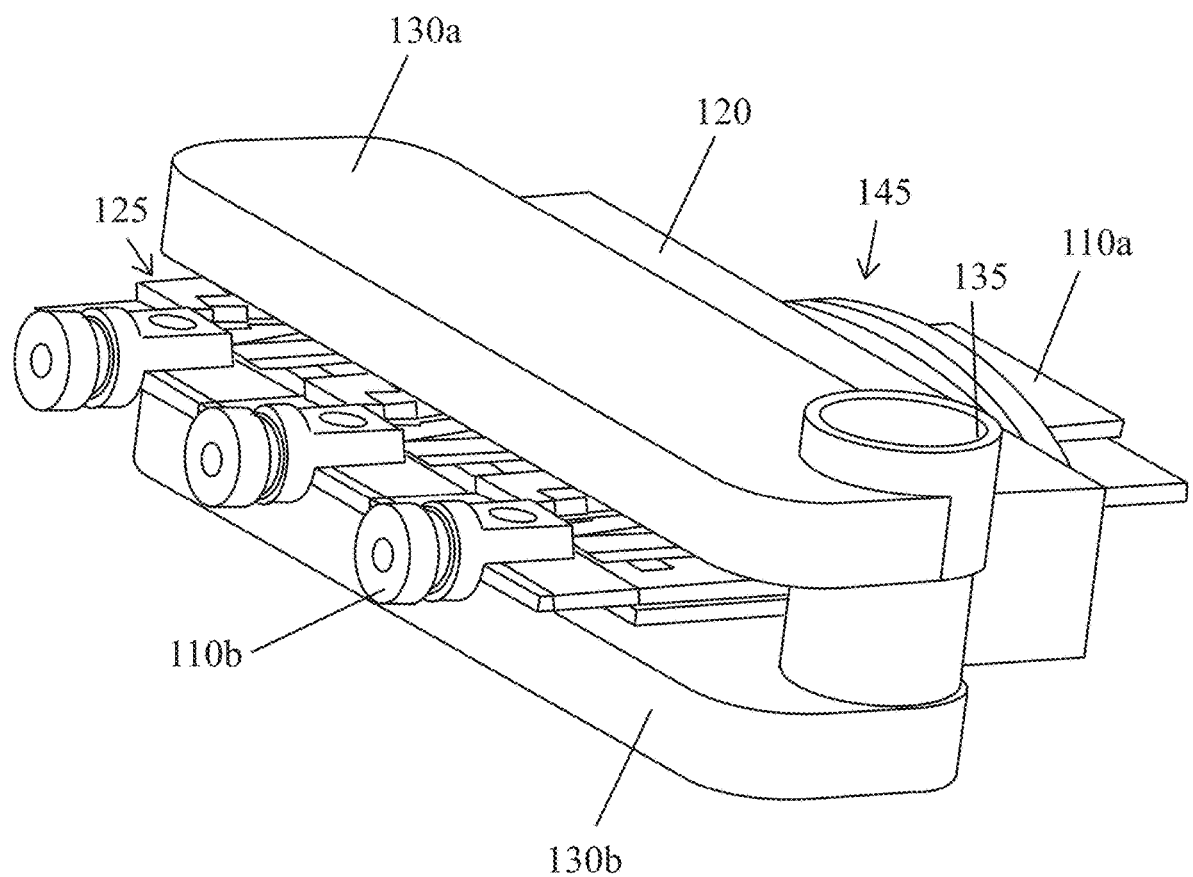
FIG. 5 illustrates some of the internal components in the first exemplary device for cooling a power electronics module using a fluid of FIGS. 1-3, according to some aspects of the present disclosure.

FIG. 5 illustrates some of the internal components in the first exemplary device 100 for cooling a power electronics module 125, according to some aspects of the present disclosure. In some embodiments, the electrical connections 110 may include a substantially planar electrical connection 110a (i.e., a busbar) and/or a substantially cylindrical electrical connection 110b. The substantially cylindrical electrical connections 110b may be bolted, welded, screwed, soldered, sintered, or glued to the power electronics module 125 and may provide an electrical connection to the motor of the vehicle. The substantially cylindrical electrical connections 110b may have at least one groove (not shown) which may interlock with the thickness 107 to form a fluid and/or mechanical seal. In some embodiments, an o-ring or gasket may be present in the groove to facilitate the seal. The substantially planar electrical connections 110b may be direct current (DC) or alternating current (AC) connections.

In some embodiments, the electrical connections 110 may connect the power electronics module 125 to other parts of the vehicle which require power, such as the air conditioning system, navigation system, radio/sound system, or a display system and to the vehicle's battery and/or capacitor. The electrical connections 110 may be made with a substantially conductive material, so as to transfer electricity (i.e., energy) to other parts of the vehicle. The electrical connections 110a and 110b may contact at least a portion of the power electronics module 125. That is, the electrical connections 110 may be in thermal and/or electrical communication with the power electronics module 125.

Figure 6A:
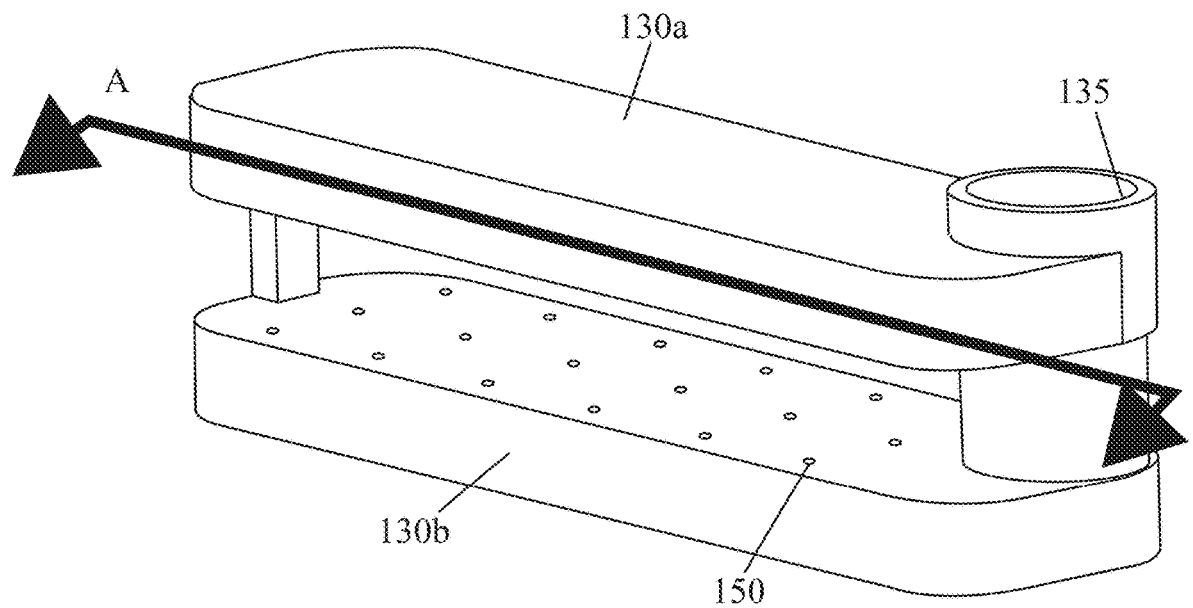
FIG. 6A illustrates an isometric view of the manifold in the first exemplary device for cooling a power electronics module using a fluid and FIG. 6B illustrates a cross section view of the manifold in the first exemplary device for cooling a power electronic module using a fluid, according to some aspects of the present disclosure.
Figure 6B:
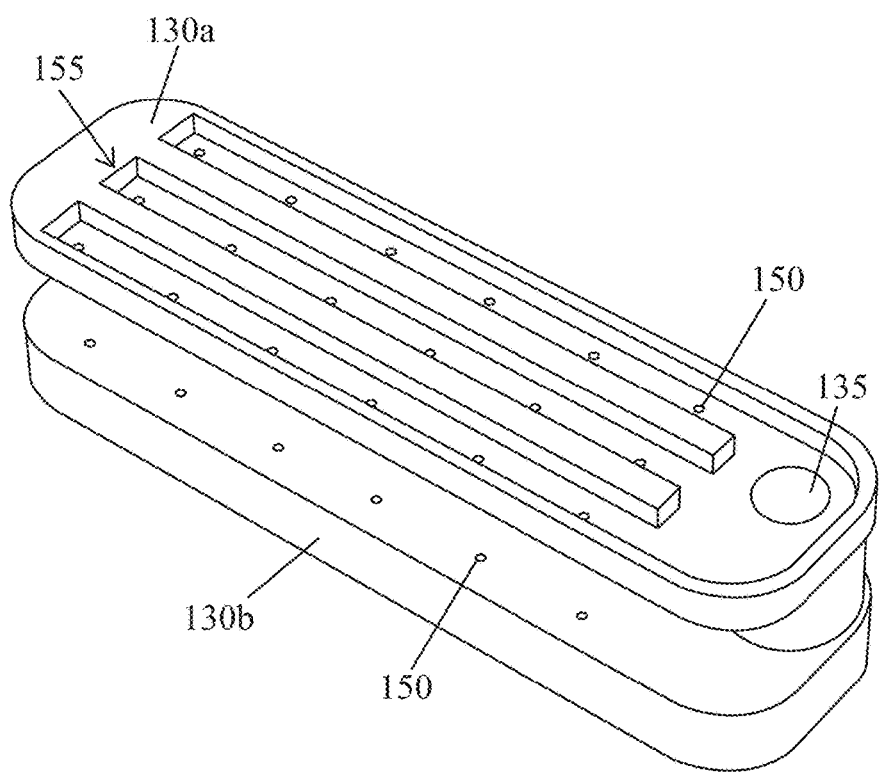

FIG. 6A illustrates an isometric view of the manifold 130 in a first exemplary device 100 for cooling a power electronics module 125 using a fluid and FIG. 6B illustrates a cross section view of the manifold 130 in the first exemplary device 100 cut along line A, according to some aspects of the present disclosure. The manifold 130 includes two parts (upper 130a and lower 130b) that may be interlocked, soldered, sintered, welded, glued, screwed, or otherwise connected. In some embodiments, the two parts 130a and 130b may be a single component, which may be made using additive manufacturing, 3D printing, or molding. Each manifold 130a and 130b have a plurality of jets 150 and channels 155, which may direct the fluid to impinge on (i.e., contact at a relatively high velocity) the power electronics module 125. The exemplary manifold 130 shown in FIGS. 5-6 contains 36 jets, although a manifold 130 may contain more or less jets. The exemplary manifold 130a shown in FIG. 6B contains three channels 155, although a manifold 130 may contain more or less channels 155. In some embodiments, the channels 155 may be relatively parallel to each other (as shown in FIG. 6B). In other embodiments, the channels 155 may not be parallel to each other, and may even intersect. The channels 155 may be indentations in the manifold 130 creating paths for the fluid to flow. The manifold 130 contains a tube 135 which may be connected to the first port 115a (i.e., the inlet). The tube 135 may direct the fluid from the first port 115a to impinge on one or both sides of the power electronics module 125 through the upper manifold 130a and/or lower manifold 130b. After impinging on the power electronics module 125 the fluid may exit the housing 105 through the second port 115b.

Figure 7A:
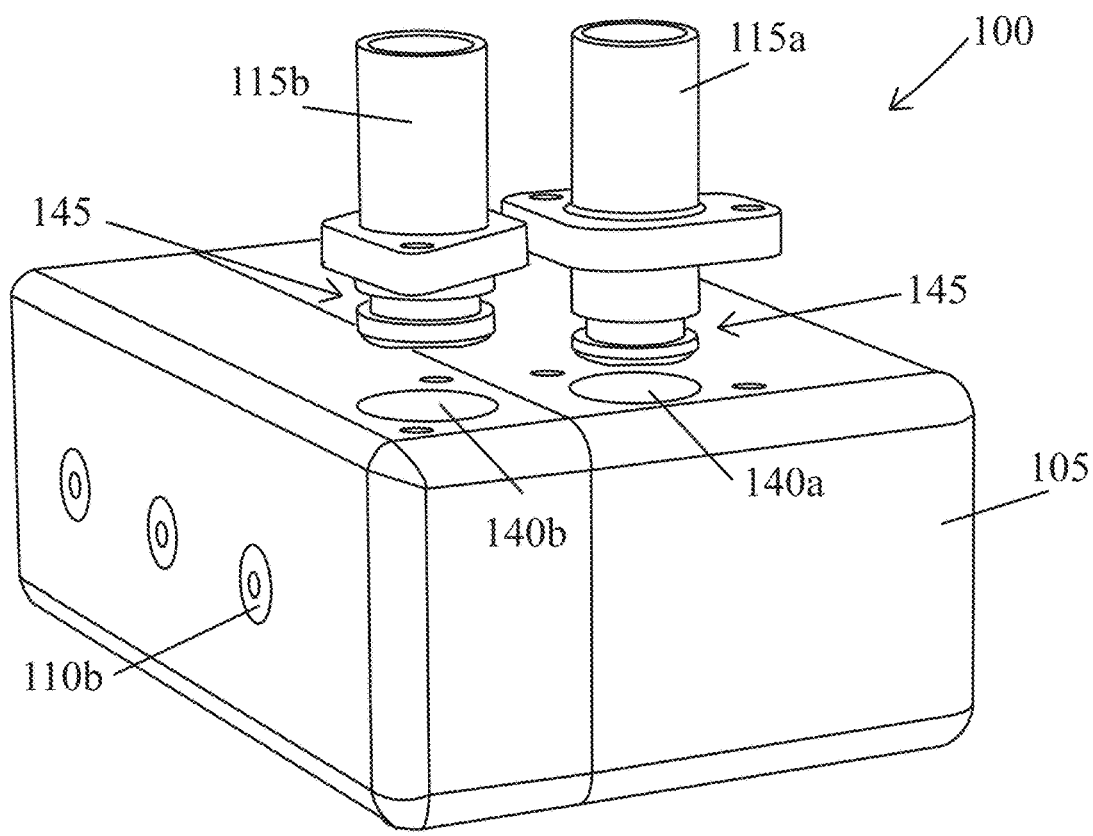
FIG. 7A illustrates an exploded view of the first exemplary device for cooling a power electronics module using a fluid and FIG. 7B illustrates a port in the first exemplary device for cooling a power electronics module using a fluid, according to some aspects of the present disclosure.
Figure 7B:
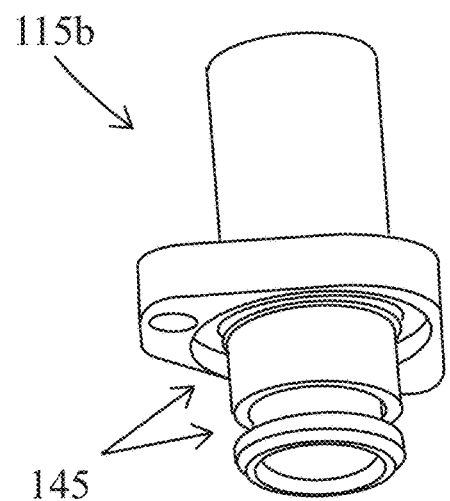

FIG. 7A illustrates an exploded view of the first exemplary device 100 for cooling a power electronics module 125 using a fluid and FIG. 7B illustrates a port in the first exemplary device 100 for cooling a power electronics module 125 using a fluid, according to some aspects of the present disclosure. The first exemplary device 100 includes a housing 105 which may create a mechanical and/or fluid seal with electrical connections 110a and 110b and/or a first port 115a and/or a second port 115b. The mechanical and/or fluid seal may be created using grooves 145 on the ports 115a and/or 115b or on the housing 105 (i.e., on the thickness 107) (not shown). The grooves 145 may interlock with the thickness 107 to create a gasket or tight seal. The first port 115a may extend through a first opening 140a in the housing 105 which may extend through the thickness 107. The first opening 140a may connect to the tube 135 of the manifold 130 as shown in FIG. 6A. The first port 115a may also have at least one o-ring groove to allow for creating a seal with the thickness 107 and/or the tube 135. The second port 115b may extend through a second opening 140b in the housing 105 which may extend through the thickness 107.

In some embodiments, the housing 105 may be made of a plastic, a ceramic, a metal, and/or a fiberglass material. The housing 105 may be made of a substantially solid material capable of containing (i.e., encompassing or enclosing) the power electronics module 125. In some embodiments, the housing 105 may be made of several components connected (e.g., soldered, sintered, welded, glued, nailed, screwed, or interlocked) together. In other embodiments, the housing 105 may be a single component.

In some embodiments, the manifold 130 may be made of a substantially dielectric or insulative material, such as plastic, ceramic, fiberglass, composite, epoxy, or a mixture thereof. In some embodiments, the manifold 130 may be made of a substantially conductive material, such as a metal (e.g., copper, aluminum). In some embodiments, the manifold 130 may be made of individually made components which may be assembled, press fit, and/or joined together using solder, braze, epoxy, and/or a thermal interface material.

In some embodiments, the molding 120 may be made of a substantially dielectric or insulative material, such as plastic, ceramic, fiberglass, composite, epoxy, rubber, or a mixture thereof. In some embodiments, the molding 120 may be capable of encompassing electrical connections 110 and forming a seal between the housing 105 and the electrical connections 110. That is, the molding 120 may be positioned between the housing 105 and the electrical connections 110 such that any fluid contained in the housing would not leak through the opening the electrical connections 110 extend through.

In some embodiments of the first exemplary device 100, the fluid may contact the power electronics module 125 directly and the fluid may be dielectric fluid. Exemplary dielectric fluids may be a solution containing at least one synthetic hydrocarbon such as a mineral oil, hexane, heptane, silicone oil, water, benzene, an ester, transformer oil, a perfluoroalkane, an alkane, and/or transmission fluid. In some embodiments, the fluid may be a dielectric fluid already in use in the power electronics 125 system, such as a transmission fluid or a battery coolant. In some embodiments, the fluid may be a refrigerant. The first exemplary device 200 may allow for the power electronics module 125 to be cooled from a single side (i.e., by having the fluid contact a single side of the power electronics module 125 directly) or from both sides (i.e., by having the fluid contact both sides of the power electronics module 125 directly).

Figure 8:
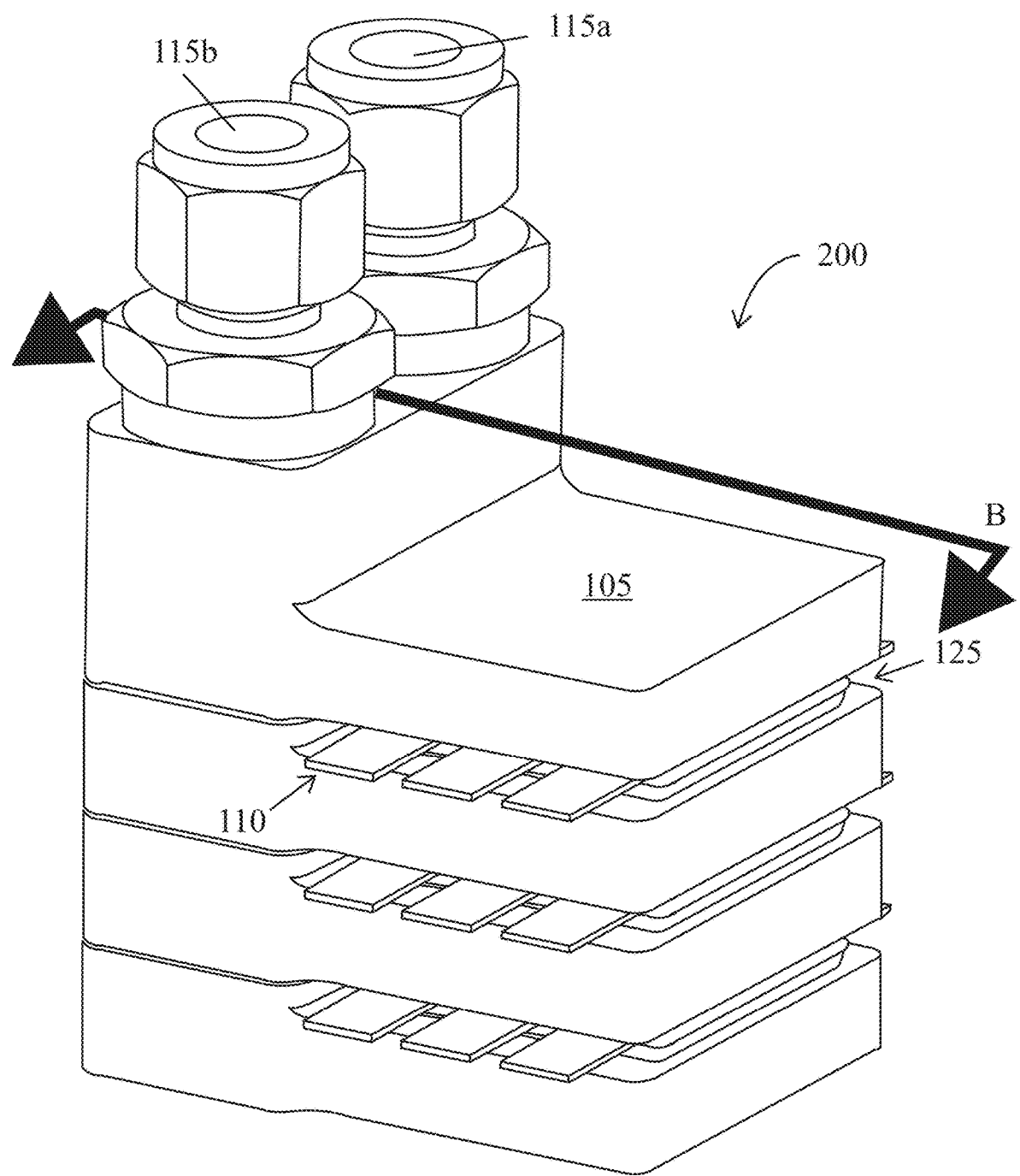
FIG. 8 illustrates a second exemplary device for cooling a power electronics module using a fluid, according to some aspects of the present disclosure.

FIG. 8 illustrates a second exemplary device 200 for cooling a power electronics module 125 using a fluid, according to some aspects of the present disclosure. Similar to the first exemplary device 100, the second exemplary device 200 includes a housing 105 connected to a first port 115a and a second port 115b. The housing 105 may contain (i.e., enclose or encompass) the power electronics module 125 (not shown in FIG. 8). In some embodiments, baffles (i.e., extensions) may be present in the housing 105 to guide the fluid to contact the electrical connections 110 for cooling. Electrical connections 110 may extend out of the housing 105. Within the housing 105 the electrical connections 110 may contact the power electronics module 125. In some embodiments, a plurality of fins 165 (not shown in FIG. 8) may extend from the electrical connections 110 to allow for additional heat dissipation. The electrical connections 110 may contact the fluid directly, to allow for heat removal from the electrical connections 110 to the fluid. The second exemplary device 200 may be substantially modular. That is, the second exemplary device 200 may be used to cool more than one power electronics module 125 by adding additional housings 105 and/or manifolds 130.

Figure 9:
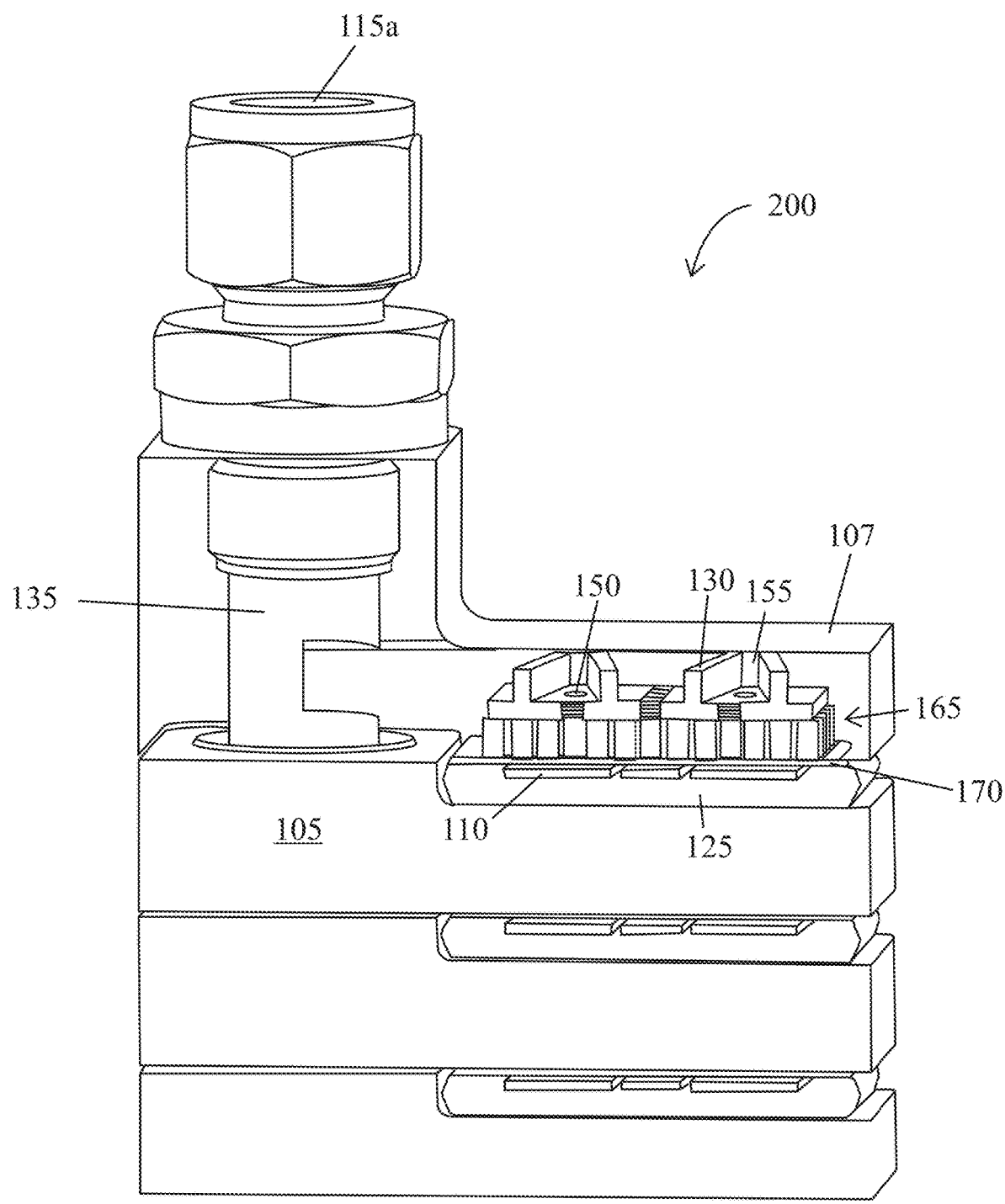
FIG. 9 illustrates a cross sectional view of the second exemplary device for cooling a power electronics module using a fluid, according to some aspects of the present disclosure.

FIG. 9 illustrates a cross sectional view of the second exemplary device 200 for cooling a power electronics module 125 using a fluid, according to some aspects of the present disclosure. The device 200 shown in FIG. 9 was cut along line B in FIG. 8. The device 200 includes a housing 105 which contacts the power electronics module 125. Electrical connections 110 may extend through the housing 105 and may contact the power electronics module 125. A manifold 130 is contained within the housing 105. The manifold 130 may have at least one jet 150 and channel 155. A plate 170 may be connected to the power electronics module 125. The manifold 130 may be oriented so that the jets 150 would direct onto the surface of the plate 170. In some embodiments, a plurality of fins 165 may extend from the plate 170. The fluid may enter the housing 105 via the first port 115a and the tube 135, then flow to the manifold 130 which may direct the fluid through the channels 155 to the jets 150. After exiting the jets 150 the fluid may impinge on the plate 170 and may flow through the fins 165.

Figure 10:
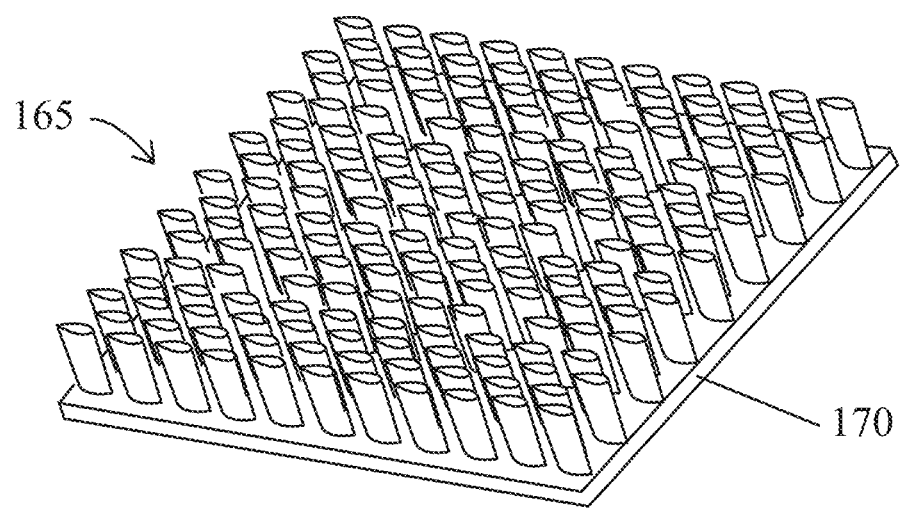
FIG. 10 illustrates a plurality of fins in the second exemplary device for cooling a power electronics module using a fluid, according to some aspects of the present disclosure.

FIG. 10 illustrates a plurality of fins 165 in the second exemplary device 200 for cooling a power electronics module 125 using a fluid, according to some aspects of the present disclosure. In some embodiments, the individual fins 165 may have a substantially elliptical cross section. The fins 165 may be substantially perpendicular to the plate 170. The fins 165 may be spaced such that the fluid may flow through the fins 165. The fins 165 shown in FIG. 10 could also be used in some embodiments of the first exemplary device 100. In such an embodiment of the first exemplary device 100, the fins 165 may extend from the electrical connections 110.

Figure 11:
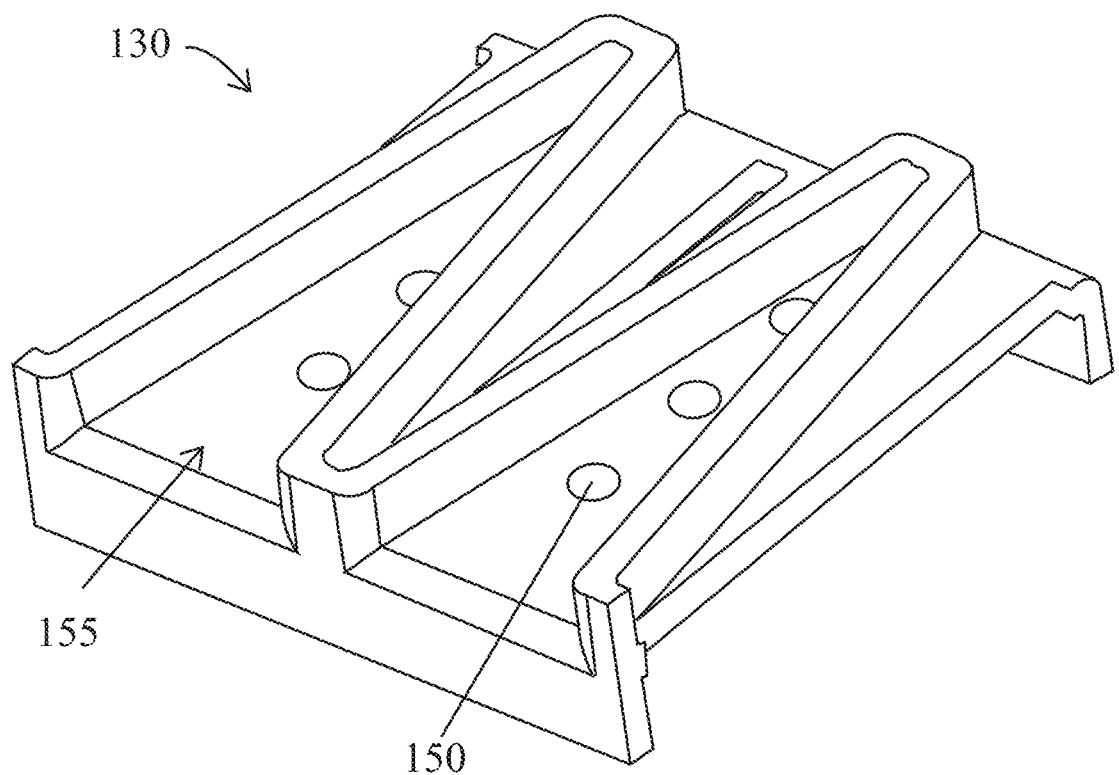
FIG. 11 illustrates a manifold in the second exemplary device for cooling a power electronics module using a fluid, according to some aspects of the present disclosure.

FIG. 11 illustrates a manifold 130 in the second exemplary device 200 for cooling a power electronics module 125 using a fluid, according to some aspects of the present disclosure. The manifold 130 may include at least one channel 155. In some embodiments, as shown in FIG. 11, the channel 155 may have a substantially triangular or conical shape, wherein the opening of the channel 155 is larger than the terminal end of the channel 155. The manifold 130 may include at least one jet 150. The jet 150 may be substantially circular or elliptical in shape (as shown in FIG. 11) or may be substantially rectangular or polygonal. The manifold 130 may be used to direct the fluid to contact or impinge the power electronics module 125. In some embodiments, the manifold 130 may direct the fluid in such a way that the velocity of the fluid may increase.

In some embodiments of the second exemplary device 200, the fluid may contact the plate 170 directly and not contact the power electronics module 125 directly. In such embodiments, the fluid may be substantially conductive. Examples of a conductive fluid may be a solution including water and ethylene glycol or propylene glycol. Note that the second exemplary device 200 may allow for the power electronics module 125 to be cooled from either one side or both sides (i.e., through a single plate 170 or through at least two plates 170 located on either side of the power electronics module 125).

Figure 12:
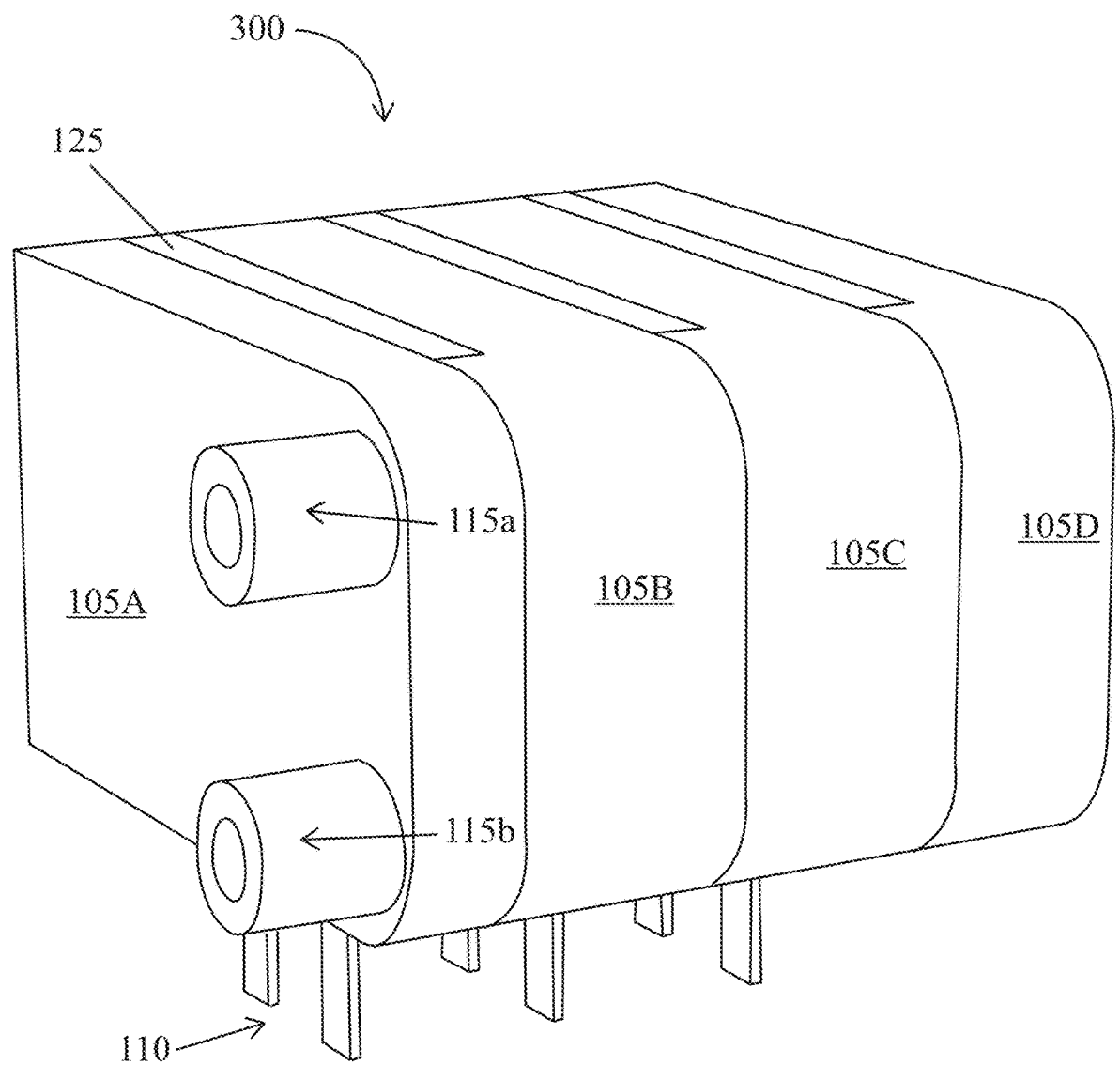
FIG. 12 illustrates an external view of a third exemplary device for cooling a power electronics module using a fluid, according to some aspects of the present disclosure.

FIG. 12 illustrates an external view of a third exemplary device 300 for cooling a power electronics module 125 using a fluid, according to some aspects of the present disclosure. The third exemplary device 300 includes a housing (shown as a front housing 105A, a second housing 105B, a third housing 105C, and a rear housing 105D) containing the power electronics module 125 (not shown in FIG. 12). The front housing 105A has a first port 115a and a second port 115b. Either port 115a or 115b may act as a fluid inlet and either port 115a or 115b may act as a fluid outlet. Electrical connections (i.e., busbars) 110 extend from the device 300. In some embodiments the electrical connections 110 may be connected to the plate 170 (not shown in FIG. 12) or may contact at least a portion of the power electronics module 125. Note that the third exemplary device 300 may be modular and may be used to cool more than one power electronics module 125 in some embodiments. Regardless of the number of power electronics modules 125, the front housing 105A and the rear housing 105D would be present on either side the power electronics module(s) 125. If more than one power electronics module 125 is present, additional housings (such as second housing 105B and third housing 105C) may be used.

Figure 13:
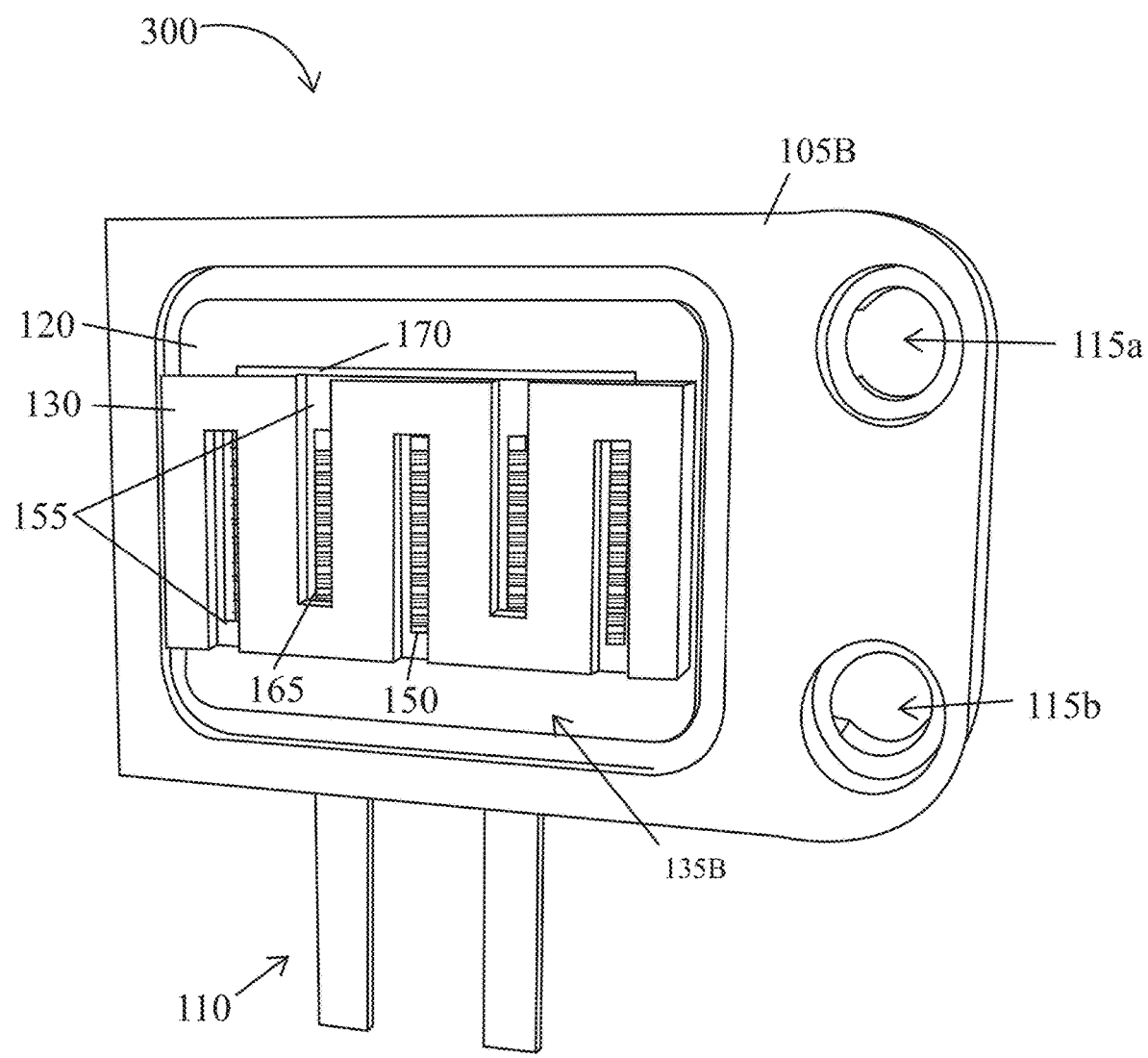
FIG. 13 illustrates a cut-away view of the third exemplary device for cooling a power electronics module using a fluid, according to some aspects of the present disclosure.

FIG. 13 illustrates a cut-away view of the third exemplary device 300, according to some aspects of the present disclosure. FIG. 13 shows the device 300 with the front housing 105A removed, so the internal components may be shown. The molding 120 has two large channels 155. A manifold 130 is connected to the molding 120 and has several channels 155. Within the housing 105B is a plate 170 which is connected (i.e., in electrical connection with) to a power electronics module 125 (not shown in FIG. 13). A plurality of fins 165 extend from the plate 170 and can be seen through the jets 150 in the manifold 130. In some embodiments, a fluid (not shown) may enter the housing 105 through one of the ports 115. From there the fluid may enter the channels 155 in the manifold 130. The fluid may impinge on the plate 170 by flowing through the jets 150 and the plurality of fins 165. The fluid may exit the manifold 130 through the channels 155, then to one of the ports 115.

Figure 14:
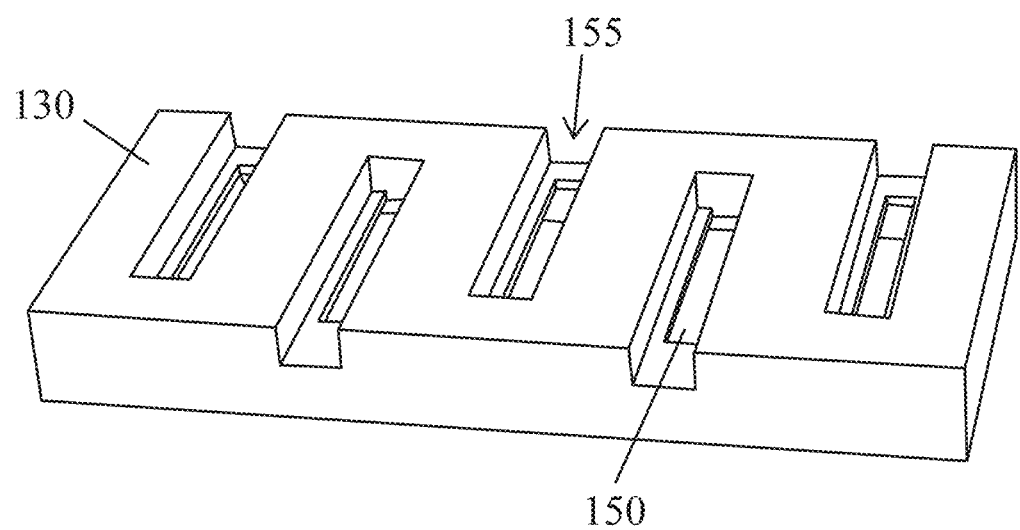
FIG. 14 illustrates a manifold within the third exemplary device for cooling a power electronics module using a fluid, according to some aspects of the present disclosure.

FIG. 14 illustrates a manifold 130 within the third exemplary device 300, according to some aspects of the present disclosure. The manifold 130 may have several channels 155. In some embodiments, the channels 155 may have openings towards the sides of the manifold 130. These openings may alternate sides of the manifold 130. The exemplary manifold 130 shown in FIG. 15 contains five channels 155, but any number of channels 155 may be used in a manifold 130. The channels 155 may have a plurality of jets 150. A jet 150 may be an opening extending through the manifold 130 to allow fluid to flow through the manifold and imping on the plate 170 or the power electronics module 125 (not shown in FIG. 14).

Figure 15:
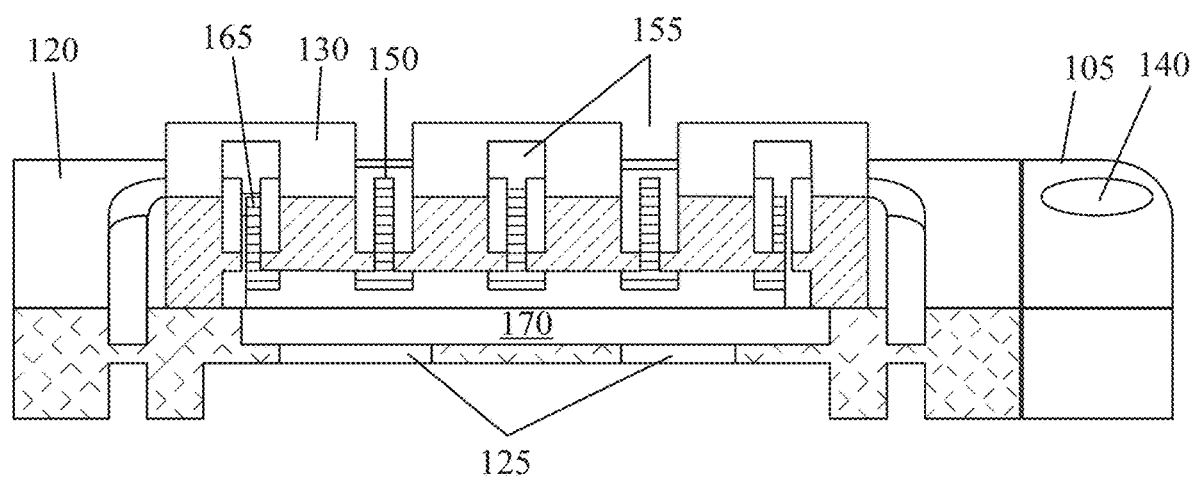
FIG. 15 illustrates a cross-sectional view of the internal components the third exemplary device for cooling a power electronics module using a fluid, according to some aspects of the present disclosure.

FIG. 15 illustrates a cross-sectional view of the internal components of the third exemplary device 300 for cooling a power electronics module 125 using a fluid, according to some aspects of the present disclosure. As shown in FIG. 15, the third exemplary device 300 includes the housing 105 with at least one port 115 and a molding 120. Within the molding 120 is the manifold 130, with several channels 155. A channel 155 may contains at least one jet 150, through which a plurality of fins 165 may be seen. The plate 170 is on the opposite side of the plurality of fins 165 from the manifold 130. The power electronics module 125 is connected to the opposite side of the plate 170 from the plurality of fins 165.

Figure 16:
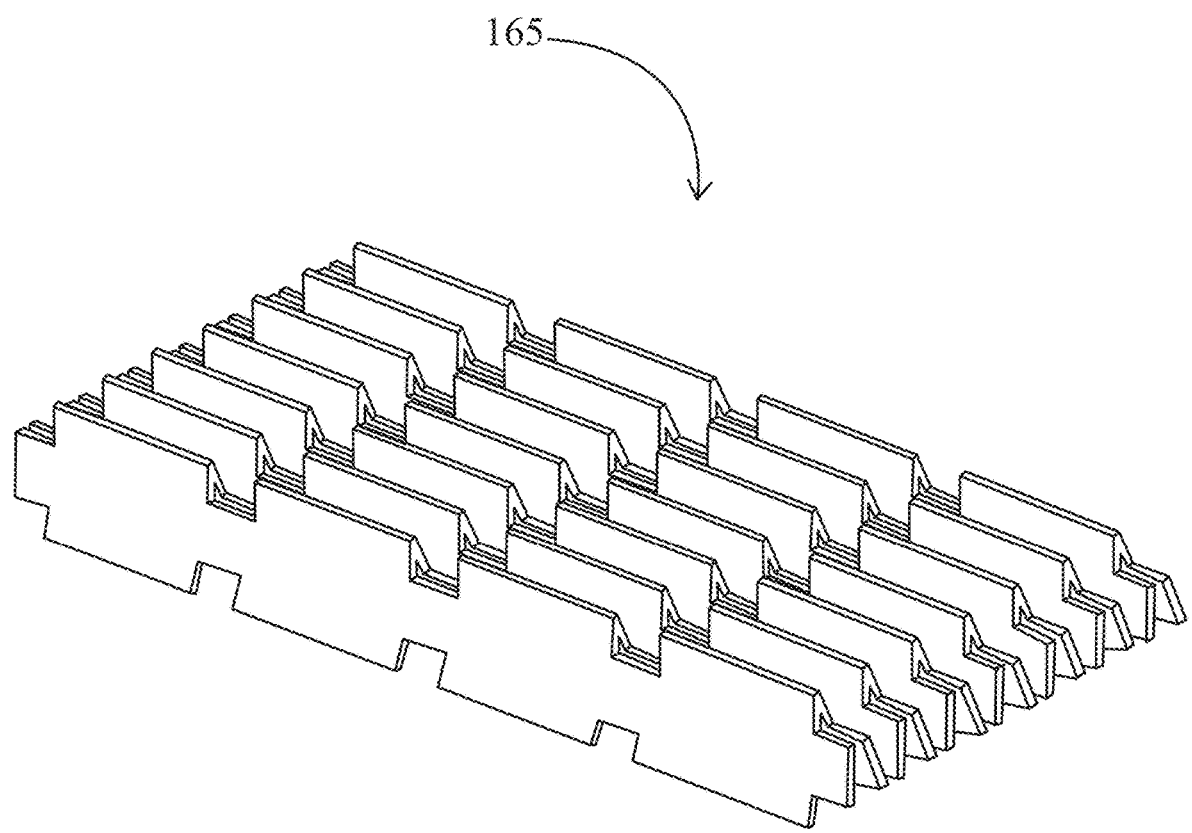
FIG. 16 illustrates the fins within the third exemplary device for cooling a power electronics module using a fluid, according to some aspects of the present disclosure.

FIG. 16 illustrates the fins 165 within the third exemplary device 300 for cooling a power electronics module 125 using a fluid, according to some embodiments of the present disclosure. The fins 165 shown in FIG. 16 may be used in a first exemplary device 100 or a second exemplary device 200 as extending from the electrical connections 110 and/or the plate 170. As used herein, fins 165 refers to an array of individual fins, substantially grouped together. As shown in the example of FIG. 16, the fins 165 may be said to be "folded" or "tented." In some embodiments, the fins 165 may comprise a sheet of material which is folded "accordion style" to create multiple folds, which may be substantially symmetrical, allowing a fluid to flow on either or both sides of the fins 165. In some embodiments, the fins 165 include a first side and a second side, angled together with various cut out openings allowing cooling fluid to enter the fins 165 and/or contact the fins 165 on both sides. The cut outs may allow the fluid to enter the fins 165 and contact the plate 170, then the cut outs may allow the fluid to exit the fins 165. In some embodiments, the fins 165 may have a profile or cross-section which is substantially triangular, square, rounded, or a series of profiles/shapes. The cooling fluid (not shown) can flow between the fins 165 and through the cut-out openings under and/or over the "folds" of the fins 165. In some embodiments, the fins 165 may be "pins" or "spines" and may be substantially cylindrical extensions of the plates 170. The fins 165 are heat transfer surface enhancements for the plates 170. The fins 165 may be assembled, press-fit, and/or joined to the plates 170 using solder, braze, epoxy, and/or a thermal interface material. The fins 165 enhance (i.e., increase the speed and efficacy of) the conductive and convective heat transfer from the power electronics module 125 to the fluid (not shown). In some embodiments, the fins 165 may be made of a substantially conductive material such as copper and/or aluminum.

Figure 17:
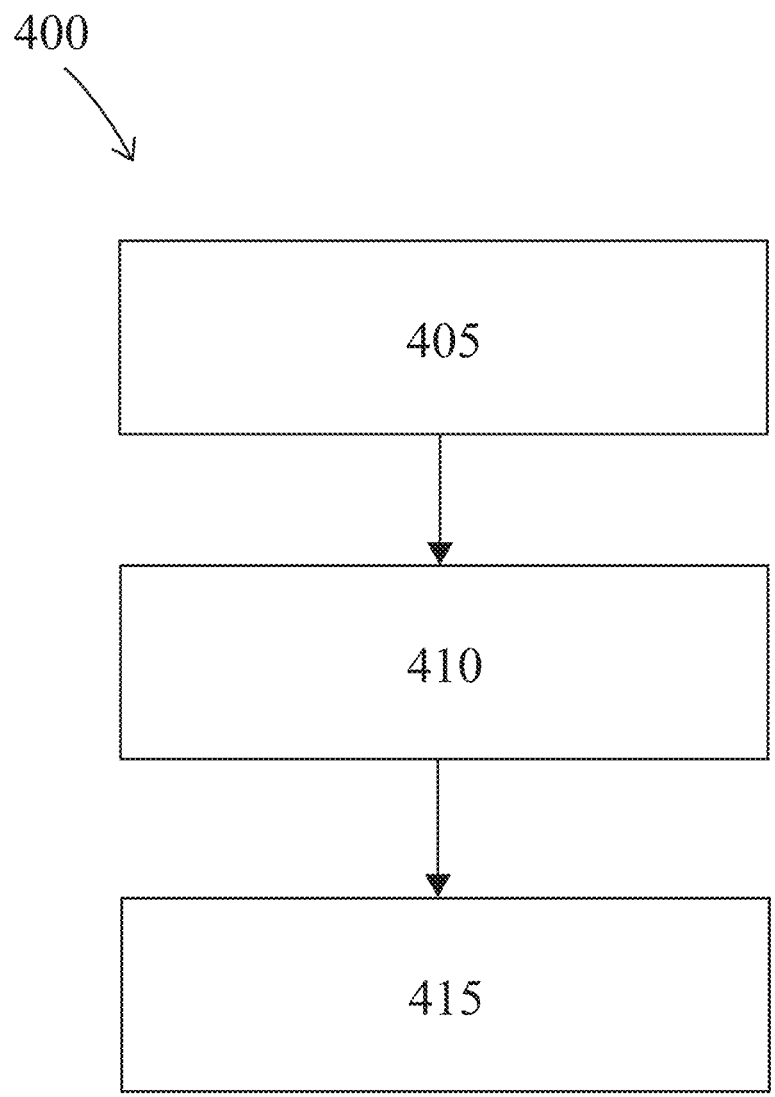
FIG. 17 illustrates a method for cooling a power electronics module using a fluid, according to some aspects of the present disclosure.

FIG. 17 illustrates a method 400 for cooling a power electronics module 125 using a fluid, according to some aspects of the present disclosure. The method 400 may include positioning 405, directing 410, and impinging 415. The method 400 may be performed using any of the exemplary devices 100, 200, or 300 described herein, or using other embodiments of the present disclosure.

The first step of the method 400 is positioning 405 the power electronics module 125 within a housing 105. In some embodiments, the positioning 405 may include extending an electrical connection 110 through the thickness 107 of the housing 105 to contact at least a portion of the power electronics module 125. In some embodiments, the positioning 405 may include extending an electrical connection 110 through a molding 120. In some embodiments, the positioning 405 may include extending a molding 120 through the thickness 107 of the housing 105 to contact at least a portion of the power electronics module 125. The molding 120 and the thickness 107 may be interlocked using grooves 145 to create a gasket or mechanical seal.

The next step of the method 400 is directing 410 a fluid to enter a manifold 130 and/or contact the power electronics module 125. The directing 410 may comprise using the manifold 130 to direct (or guide) the fluid path to contact the power electronics module 125. In some embodiments, the directing 410 may result in the fluid contacting both a first side and a second side of the power electronics module 125. In some embodiments, the directing 410 may include allowing the fluid to enter the housing 105 through a first port 115a, contacting the power electronics module 125 with the fluid, and allowing the fluid to exit the housing 105 through a second port 115b. In some embodiments, the manifold 130 may direct 410 the fluid in such a way as to substantially increase the velocity of the fluid.

The next step of the method 400 is impinging 415 the fluid on the power electronics module 125. In some embodiments, the fluid may be impinged 415 directly on the power electronics module 125 (i.e., the fluid may contact the power electronics module 125 directly). In some embodiments, the fluid may be impinged 415 on a plate 170 connected to the power electronics module 125. The plate 170 may be in thermal communication with the power electronics module 125 such that impinging 415 the plate 170 results in a cooling effect on the power electronics module 125. In some embodiments, a plurality of fins 165 may extend from the plate 170 and the impinging 415 may result in the fluid contacting the plurality of fins 165.

The present disclosure describes devices capable of cooling power electronics modules 125, such as insulated-gate bipolar transistors modules (IGBT modules), diodes, metal-oxide semiconductor field effect transistors modules (MOSFET modules). and/or other electrical components. The fluid (not shown) utilized herein may be based on the design of the device utilized, and whether the cooling fluid will contact the power electronics module 125 directly or may contact non-electrically active components. In some embodiments, such as for power electronics modules for vehicles or automobiles, when the fluid will contact the power electronics module 125 directly (such as for the first exemplary device 100 shown in FIGS. 1-7), the fluid may be a dielectric fluid. In this way, a new fluid may not need to be introduced to the vehicle system to cool the power electronics module 125. Examples of dielectric fluids include synthetic hydrocarbons such as transformer fluid, mineral oil, and/or perfluoroalkanes. In some embodiments, when the fluid will not contact the power electronics module 125 directly (but will contact the plate 170) such as in exemplary devices 200 and 300, the fluid may be a conductive fluid, such as water ethylene glycol or propylene glycol.

Figure 18:
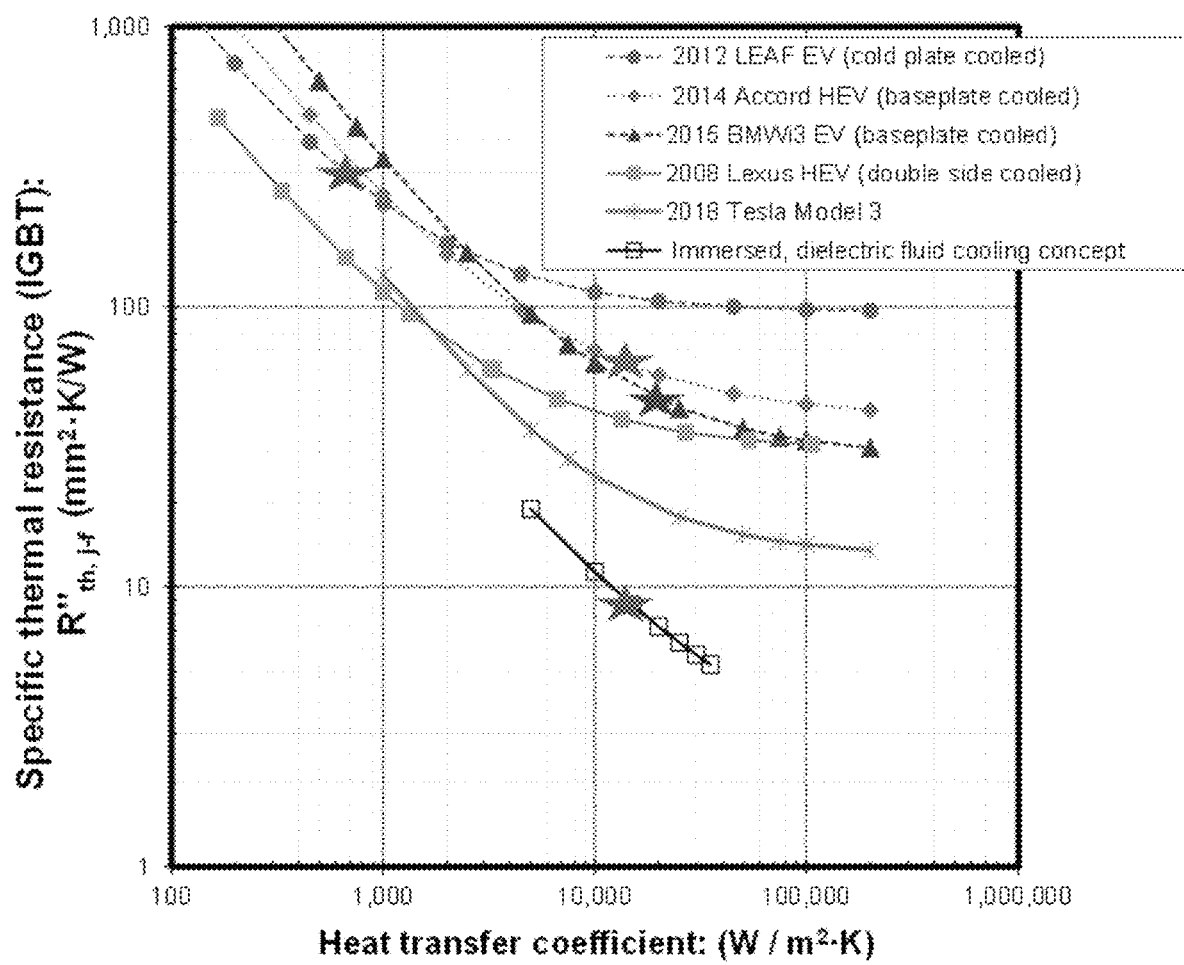
FIG. 18 illustrates the improved thermal performance (as shown by lower thermal resistance) of the first exemplary device for cooling a power electronics module using a fluid compared with existing automotive solutions, according to some aspects of the present disclosure.

FIG. 18 illustrates the improved thermal performance (as shown by lower thermal resistance) of the first exemplary device 100 for cooling a power electronics module 125 using a fluid compared with existing automotive solutions, according to some aspects of the present disclosure. The graph shown in FIG. 18 was generated using modeling data and was validated using small scale experiments. The stars denote the performance of each device at a fluid flow rate of approximately 10 L/min. The graph shown in FIG. 18 illustrates how the first exemplary device 100 has significantly lower thermal resistance than existing automotive solutions. For example, the first exemplary device 100 has approximately an 81% lower thermal resistance than a cooling device for a 2015 BMW i3 EV (a thermal resistance of approximately 9 mm$^2$ K/W for the device 100 compared to a thermal resistance of approximately 49 mm$^2$ K/W for the 2015 BMW i3 EV).

Figure 19:
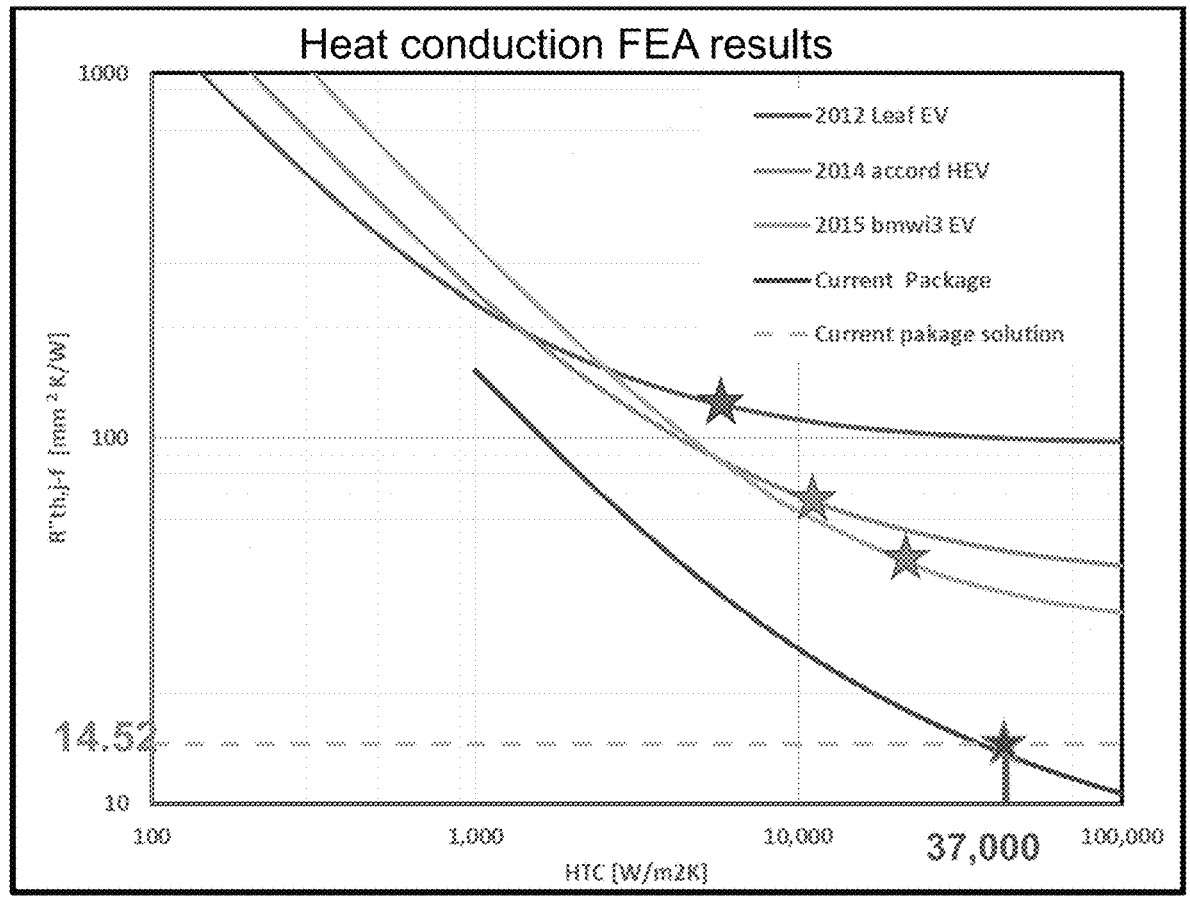
FIG. 19 illustrates the improved thermal performance (as shown by lower thermal resistance) of the second exemplary device for cooling a power electronics module using a fluid compared with existing automotive solutions, according to some aspects of the present disclosure.

FIG. 19 illustrates the improved thermal performance (as shown by lower thermal resistance) of the second exemplary device 200 for cooling a power electronics module 125 using a fluid compared with existing automotive solutions, according to some aspects of the present disclosure. The graph shown in FIG. 19 was generated using modeling data and was validated using small scale experiments. The stars denote the performance of each device at a fluid flow rate of approximately 10 L/min. The graph shown in FIG. 19 illustrates how the second exemplary device 200 has significantly lower thermal resistance than existing automotive solutions. For example, the second exemplary device 200 has approximately a 70% lower thermal resistance than a cooling device for a 2015 BMW i3 EV.

EXAMPLES

Example 1. A system for cooling a power electronics module using a fluid, the system comprising a housing comprising a thickness and configured to contain the power electronics module; a molding configured to extend through the thickness and contact at least a portion of the power electronics module; an electrical connection configured to extend through the molding and contact at least a portion of the power electronics module; and a manifold positioned within the housing; wherein: the power electronics module comprises a first side and a second side, the manifold is configured to direct the fluid to contact the first side and the second side, and the fluid is configured to contact the power electronics module and the electrical connection inside the housing.

Example 2. The system of Example 1, further comprising: a first port configured to extend through the thickness; and a second port configured to extend through the thickness; wherein: the fluid is configured to enter the housing through the first port, and the fluid is configured to exit the housing through the second port.

Example 3. The system of claim 2, wherein the first port is configured to form a seal with the thickness.

Example 4. The system of claim 3, wherein the seal comprises at least one o-ring or groove.

Example 5. The system of any of claims 2-4, wherein the second port is configured to form a seal with the thickness.

Example 6. The system of any of claims 2-5, wherein the seal comprises at least one o-ring or groove.

Example 7. The system of any of Examples 1-6, wherein the fluid comprises a dielectric fluid.

Example 8. The system of Example 7, wherein the dielectric fluid comprises a synthetic hydrocarbon.

Example 9. The system of Examples 7 or 8, wherein the dielectric fluid comprises at least one of a mineral oil, hexane, heptane, silicone oil, water, benzene, an ester, transformer oil, a perfluoroalkane, or an alkane.

Example 10. The system of any of Examples 7-9, wherein the dielectric fluid comprises an automotive fluid or transmission fluid.

Example 11. The system of any of Examples 110, wherein the housing comprises at least one of plastic, ceramic, or fiberglass.

Example 12. The system of any of Examples 1-11, wherein: the molding is configured to create a seal with the thickness, and the seal comprises interlocking grooves of the molding and the thickness.

Example 13. The system of Example 12, wherein: the seal comprises a gasket or an o-ring.

Example 14. The system of any of Examples 1-13, wherein the molding is configured to contact the first side and the second side of the power electronics module.

Example 15. The system of any of Examples 14, wherein: the electrical connection comprises a planar surface which extends through the molding.

Example 16. The system of Example 15, wherein the electrical connection comprises at least one fin.

Example 17. The system of Example 16, wherein the at least one fin comprises an elliptical cross-section.

Example 18. The system of Example 16, wherein the at least one fin comprises a folded structure.

Example 19. The system of Example 18, wherein the folded structure comprises at least one cut out.

Example 20. The system of any of Examples 1-19, wherein: the molding comprises at least one slot, and the electrical connection extends through the slot.

Example 21. The system of Example 20, wherein: the electrical connection comprises a cylindrical extension which extends through the thickness.

Example 22. The system of Example 21, wherein the electrical connection comprises at least one fin.

Example 23. The system of Example 22, wherein the at least one fin comprises an elliptical cross-section.

Example 24. The system of Example 22, wherein the at least one fin comprises a folded structure.

Example 25. The system of Example 24, wherein the folded structure comprises at least one cut out.

Example 26. The system of any of Examples 1-25, wherein: the cylindrical extension is configured to create a seal with the thickness, and the seal comprises interlocking grooves of the cylindrical extension and the thickness.

Example 27. The system of any of Examples 1-26, wherein: the manifold comprises a first channel and a second channel, the first channel is configured to direct the fluid to the first side of the power electronics module, and the second channel is configured to direct the fluid to the second side of the power electronics module.

Example 28. The system of any of Examples 1-27, wherein the electrical connection comprises at least one busbar.

Example 29. The system of Example 28, wherein the busbar comprises at least one of copper, aluminum, silver, or gold.

Example 30. A system for cooling a power electronics module using a fluid, the system comprising: a housing configured to contact the power electronics module; an electrical connection configured to extend through the housing and configured to contact the power electronics module; a manifold contained within the housing having at least one jet; and a plate connected to the power electronics module and oriented substantially parallel to the manifold; wherein: the fluid is configured to enter the manifold, exit the jet, and impinge on the plate.

Example 31. The system of Example 30, further comprising: a plurality of fins extending from the plate; wherein: the fluid is configured to contact the plurality of fins after exiting the slot.

Example 32. The system of Example 31, wherein the plurality of fins comprise at least one fin having an elliptical cross-section.

Example 33. The system of Example 31, wherein: the plurality of fins comprise at least one folded fin, the folded fin comprises a first side and a second side joined at an angle, and the first side and the second side contact the plate.

Example 34. The system of Example 31, wherein: at least one folded fin comprises a slot, and the slot comprises a cutout in the first side and the second side at the angle.

Example 35. The system of any of Examples 31-34, wherein the plurality of fins comprise at least one of copper, aluminum, silver, or gold.

Example 36. The system of any of Examples 31-35 wherein the fluid is configured to contact the fins.

Example 37. The system of any of Examples 30-36, further comprising: a first port connected to the housing; and a second port connected to the housing; wherein: the fluid is configured to enter the housing through the first port, and the fluid is configured to exit the housing through the second port.

Example 38. The system of any of Examples 30-37, wherein the fluid comprises water ethylene glycol or water propylene glycol.

Example 39. The system of any of Examples 30-38, wherein the housing comprises at least one of plastic, ceramic, or fiberglass.

Example 40. The system of any of Examples 30-39, wherein the plate comprises at least one of copper, aluminum, silver, or gold.

Example 41. The system of any of Examples 30-40 wherein the manifold comprises at least one channel.

Example 42. The system of Example 41, wherein the channel comprises an opening and a terminal end, and the opening is wider than the terminal end.

Example 43. A method for cooling a power electronics module using a fluid, the method comprising: positioning the power electronics module within a housing; and directing the fluid to contact the power electronics module; wherein: the power electronics module comprises a first side and a second side, and the directing comprises using a manifold to direct the fluid to contact the first side and the second side of the power electronics module.

Example 44. The method of Example 43, wherein: the housing comprises a thickness, and the positioning comprises extending a molding through the thickness to contact at least a portion of the power electronics module.

Example 45. The method of Examples 43 or 44, wherein: the molding and the thickness create a seal, and the seal comprises interlocking groves of the molding and the thickness.

Example 46. The method of any of Examples 43-45, wherein: the positioning comprises extending an electrical connection through the molding to contact at least a portion of the power electronics module.

Example 47. The method of any of Examples 43-46, wherein: the positioning comprises extending an electrical connection through the thickness to contact at least a portion of the power electronics module.

Example 48. The method of any of Examples 43-47, wherein: the directing comprises: allowing the fluid to enter the housing through a first port, contacting the power electronics module with the fluid, and allowing the fluid to exit the housing through a second port.

Example 49. The method of any of Examples 43-48, wherein the fluid comprises a dielectric fluid.

Example 50. The method of Example 49-, wherein the dielectric fluid comprises at least one of mineral oil, hexane, heptane, silicone oil, water, benzene, an ester, transformer oil, a perfluoroalkane, or an alkane.

Example 51. The method of any of Examples 43-50, further comprising impinging the fluid on a plate connected to the power electronics module.

Example 52. The method of any of Examples 43-51, wherein: a plurality of fins extend from the plate, and the impinging comprises contacting the plurality of fins with the fluid.

Example 53. The method of Example 52, wherein the plurality of fins comprise at least one fin having an elliptical cross-section.

Example 54. The method of Example 52, wherein: the plurality of fins comprise at least one folded fin, the folded fin comprises a first side and a second side joined at an angle, and the first side and the second side contact the plate.

Example 55. The method of Example 52, wherein: at least one folded fin comprises a slot, and the slot comprises a cutout in the first side and the second side at the angle.

Example 56. The method of Example 55, wherein the fluid is configured to flow through the slot.

Example 57. The method of any of Examples 52-56, wherein the plurality of fins comprise at least one of copper, aluminum, silver, or gold.

Example 58. The method of any of Examples 43-57, wherein the fluid comprises water ethylene glycol or water propylene glycol.

Example 59. The method of any of Examples 43-58, wherein the housing comprises at least one of plastic, ceramic, or fiberglass.

Example 60. The method of any of Examples 43-59 wherein the plate comprises at least one of copper, aluminum, silver, or gold.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A system for cooling a power electronics module using a fluid, the system comprising:
    a housing comprising a thickness and configured to contain the power electronics module;
    a molding comprising at least one slot and configured to extend through the thickness, creating a first seal with the thickness, and contact at least a portion of the power electronics module;
    an electrical connection extending through the slot and comprising a planar surface which extends through the molding and a cylindrical extension which extends through the thickness, creating a second seal with the thickness; and
    a manifold positioned within the housing; wherein:
    the power electronics module comprises a first side and a second side,
    the electrical connection is configured to contact at least a portion of the power electronics module,
    the manifold is configured to direct the fluid to contact the first side and the second side,
    the first seal comprises interlocking grooves of the molding and the thickness,
    the second seal comprises interlocking grooves of the cylindrical extension and the thickness, and
    the fluid is configured to contact the power electronics module and the electrical connection inside the housing.

2. The system of claim 1, further comprising:
    a first port configured to extend through the thickness; and
    a second port configured to extend through the thickness; wherein:
    the fluid is configured to enter the housing through the first port, and
    the fluid is configured to exit the housing through the second port.

3. The system of claim 1, wherein the fluid comprises a dielectric fluid.

4. The system of claim 3, wherein the dielectric fluid comprises a synthetic hydrocarbon.

5. The system of claim 1, wherein the molding is configured to contact the first side and the second side of the power electronics module.

6. The system of claim 1, wherein:
    the manifold comprises a first channel and a second channel,
    the first channel is configured to direct the fluid to the first side of the power electronics module, and
    the second channel is configured to direct the fluid to the second side of the power electronics module.

7. A method for cooling a power electronics module using a fluid, the method comprising:
    positioning the power electronics module within a housing comprising a thickness;
    directing, using a manifold positioned within the housing, the fluid to contact a first side and a second side of the power electronics module; and
    extending an electrical connection to contact at least a portion of the power electronics module; wherein:
    the positioning comprises extending a molding comprising at least one slot through the thickness, creating a first seal with the thickness, to contact at least a portion of the power electronics module, the extending comprises extending a planar surface of an electrical connection through the molding to contact at least a portion of the power electronics module and extending a cylindrical connection of the electrical connection through the thickness, creating a second seal with the thickness, to contact at least a portion of the power electronics module, the first seal comprises interlocking grooves of the molding and the thickness, and the second seal comprises interlocking grooves of the cylindrical extension and the thickness.

8. The method of claim 7, wherein:

the directing comprises:

allowing the fluid to enter the housing through a first port, contacting the power electronics module with the fluid, and allowing the fluid to exit the housing through a second port.

\* \* \* \* \*